US006891366B2

(12) United States Patent
Lenssen et al.

(10) Patent No.: US 6,891,366 B2
(45) Date of Patent: May 10, 2005

(54) MAGNETO-RESISTIVE DEVICE WITH A MAGNETIC MULTILAYER STRUCTURE

(76) Inventors: Kars-Michiel Hubert Lenssen, Prof. Holstlaan 6, 5656 AA Eindhoven (NL); Antonius Emilius Theodorus Kuiper, Prof. Holstlaan 6, 5656 AA Eindhoven (NL)

( * ) Notice: Subject to any disclaimer, the term of this patent is extended or adjusted under 35 U.S.C. 154(b) by 26 days.

(21) Appl. No.: 09/884,219

(22) Filed: Jun. 19, 2001

(65) Prior Publication Data

US 2002/0030489 A1 Mar. 14, 2002

(30) Foreign Application Priority Data

Jun. 21, 2000 (EP) .............................................. 00202153

(51) Int. Cl.$^7$ .............................................. G01R 33/02
(52) U.S. Cl. ...................................... 324/252; 365/158
(58) Field of Search ................................ 257/421–422, 257/414; 365/157–158, 171, 173; 428/692; 360/324, 324.1–324.2; 324/207.21

(56) References Cited

U.S. PATENT DOCUMENTS

| | | | |
|---|---|---|---|
| 5,686,837 A | 11/1997 | Coehoorn et al. .......... 324/252 |
| 5,701,223 A | 12/1997 | Fontana, Jr. et al. ........ 360/113 |
| 6,191,926 B1 * | 2/2001 | Everitt et al. .......... 360/324.11 |
| 6,219,209 B1 * | 4/2001 | Gill ...................... 360/324.11 |
| 6,275,363 B1 * | 8/2001 | Gill ........................ 360/324.2 |
| 6,424,507 B1 * | 7/2002 | Lederman et al. ..... 360/324.11 |
| 6,430,012 B1 * | 8/2002 | Sano et al. .............. 360/324.1 |
| 6,452,382 B1 * | 9/2002 | Tokunaga et al. ....... 324/207.21 |
| 6,507,187 B1 * | 1/2003 | Olivas et al. .......... 324/207.21 |

FOREIGN PATENT DOCUMENTS

EP          1085586 A2    9/2000    ........... H01L/43/08

* cited by examiner

*Primary Examiner*—Jay Patidar
*Assistant Examiner*—Reena Aurora

(57) ABSTRACT

A robust GMR or TMR effect type multilayer structure comprises a free and a pinned ferromagnetic layer, with a wide magnetic field range as required, for example in automotive applications. An odd number of non-adjacent ferromagnetic layers is used in an exchange-biased Artificial Anti-Ferromagnet as the pinned layer, and the exchange biasing layer is made of an IrMn type material.

10 Claims, 4 Drawing Sheets

MAGNETO-RESISTIVE DEVICE WITH A MAGNETIC MULTILAYER STRUCTURE

FIELD OF THE INVENTION

The invention relates to a magneto-resistive device comprising a substrate which carries a free and a pinned ferromagnetic layer for providing a magnetoresistive effect, said pinned layer comprising an artificial antiferromagnet layer system (AAF), and an exchange biasing layer, the exchange biasing layer being adjacent to and magnetically influencing the AAF layer system.

DESCRIPTION OF RELATED ART

Spin-valve structures such as Giant Magneto Resistance (GMR) and Spin-tunnel Magneto Resistance (TMR) devices recently have been extensively studied and have been subject of many disclosures. GMR- and TMR-devices comprise as a basic building block two ferromagnetic layers separated by a separation layer of a non-magnetic material. This structure will be referred to as the basic GMR- or TMR-stack of the magnetic device, or is referred to as the GMR- or TMR-structure. Such structure has a magneto resistance characteristic and shows the GMR- or TMR-effect. The separation is a non-ferromagnetic metallic layer for GMR-devices, and is a non-metallic, preferably insulating, layer for TMR-devices. Over the separation layer, there is a magnetic coupling between the two ferromagnetic layers. The insulating layer in the TMR-devices allows for significant probability for quantum mechanical tunneling of electrons between the two ferromagnetic layers. Of the two ferromagnetic layers, one is a so-called free layer, and the other is a so-called hard pinned layer. The free layer is a layer whose magnetization direction can be changed by applied magnetic fields with a strength lower, preferably substantially lower, than the strength of the field required for changing the magnetization direction of the pinned layer. Thus, the pinned layer has a preferred, rather fixed magnetization direction, whereas the magnetization direction of the free layer can be changed quite easily under an external applied field. A change of the magnetization of the free layer changes the resistance of the TMR- or GMR-device. This results in the so-called magneto resistance effect of these devices. The characteristics of these magnetic devices or systems can be exploited in different ways. For example a spin valve read-out element utilizing the GMR-effect can be used for advanced hard disk thin film heads. Also magnetic memory devices such as standalone or non-volatile embedded memory devices can be made based on the GMR- or TMR-elements. An example of such memory devices are MRAM devices. A further application is a sensor device or system for magnetic characteristics. Such sensors are used for example in anti-lock braking (ABS) systems or other automotive applications.

Magnetoresistive sensors are known from U.S. Pat. No. 5,686,837. Certain magnetoresistive sensors use the so-called GMR effect. Giant magnetoresistance (GMR) is the phenomenon that the resistance of a material (e.g. a magnetic multilayer) depends on the angle between magnetization directions (e.g. of different layers). Examples of GMR material systems are exchange-biased spin valves and multilayers comprising artificial antiferromagnets (AAF's). Preferably, such sensors (particularly those for automotive and industrial applications) should operate in a broad magnetic field range. Hence, magneto-resistance should pertain up to high magnetic fields. In particular for analog sensors it is advantageous if the output signal is independent of the field strength over a large field interval.

Exchange-biased spin valves show poor thermal stability or have a too small field range. On the other hand, AAF's are only stable up to limited magnetic fields. At higher magnetic fields the output characteristics can even be flipped, which is unacceptable because of safety matters.

SUMMARY OF THE INVENTION

It is an object of the present invention, in order to enable practical applications of GMR or TMR devices, to provide a magneto-resistive device that provides a substantially constant output signal in a broad magnetic field range.

The above object is met by a magneto-resistive device comprising a substrate which carries a free and a pinned ferromagnetic layer for providing a magneto-resistive effect, said pinned layer comprising an artificial antiferromagnet layer system (AAF), and an exchange biasing layer, the exchange biasing layer being adjacent to and magnetically influencing the AAF layer system wherein the AAF layer system has an odd number of non-adjacent ferromagnetic layers greater than or equal to three. By non-adjacent is meant that the ferromagnetic layers are separated from each other by non-magnetic layers. Each ferromagnetic layer may itself be composed of several sub-layers, e.g. a stack of ferromagnetic sublayers. The odd number of ferromagnetic layers in the AAF provides a very large magnetic field range. An artificial antiferromagnet AAF is a layer structure comprising alternating ferromagnetic and non-magnetic layers which have through the choice of materials and layer thicknesses such an exchange coupling that the magnetization directions of the ferromagnetic layers are antiparallel in the absence of an external magnetic field. Each ferromagnetic layer can comprise another set of ferromagnetic layers. The AAF diminishes magnetostatic coupling between the pinned and the free layer. The AAF also provides a large rigidity in magnetic fields because of the very small net magnetic moment (theoretically zero in the ideal case), however it is stable in two opposite directions.

The exchange biasing layer may comprise, for instance, an FeMn, NiMn, PtMn, NiO or most preferably an IrMn type material. The blocking temperature of IrMn is higher than that of FeMn and unlike NiMn no annealing treatment is needed. The blocking temperature is the temperature above which the exchange biasing between the antiferromagnetic IrMn type layer and the pinned layer vanishes (reduces to zero).

The AAF may comprise a Co/non-magnetic metal/Co/non-magnetic metal/Co system, but preferably a CoFe/non-magnetic metal/CoFe/non-magnetic metal/CoFe system is used, because in such systems an anisotropy can be induced.

The non-magnetic metal in the AAF is preferably Ru, which provides strong coupling and appears to be very stable (no oxidation, no diffusion) which is very important for the definition of the thinnest and most critical layer in the AAF stack.

To eliminate diffusion, Ni is preferably avoided at all interfaces with Cu. Preferably, CoFe is used instead of NiFe. Moreover, this increases the GMR ratio. Compared with Co, CoFe gives a lower coercivity (and better texture) in the free layer.

The exchange-biasing field is larger in inverted than in conventional spin valves; therefore the exchange-biasing layer is preferably positioned nearest to the substrate. However, in this case a buffer layer may be needed to obtain the required texture. Investigations showed that (2 nm) NiFe on (for example 3.5 nm) Ta is preferred.

The magneto-resistive device in accordance with the present invention may be used in a sensor, e.g. for position sensing, analog angle sensing or rotation speed sensing or in a reading head. The magneto-resistive device in accordance with the present invention may also be used in a data storage arrangement, e.g. as part of a magnetic memory structure such as a MRAM structure, preferably being integrated on a semiconductor substrate.

As indicated above, the proposed exchange-biased AAF may be used in a data storage system. An embodiment of the present invention includes integration of the whole data storage system on one semiconductor (silicon) chip with the multilayer configuration being grown or deposited on the chip. The multilayer configuration can be grown or deposited on the chip in the front-end or in the back-end of the process for making the chip. In the back-end process a part of the chip is planarized and the multilayer configuration is deposited or grown thereon. Appropriate connections by bonding or via structures are made in order to transfer the signals of the multilayer configuration to the part of the chip containing the signal processing logic. In the front-end process, the multilayer configuration is directly integrated on the semiconductor (silicon).

The layers of the data storage system of the invention can be deposited by Molecular Beam Epitaxy or MOCVD or sputter deposition or any such deposition technique known to the person of skill in the art.

The data storage system of the invention can be a magnetic memory element or a magnetic memory device and can also be a computer or an integrated circuit with a memory functionality such as a MRAM or an ASIC with an embedded non-volatile magnetic memory element or a chipcard or any such data storage system. The set of structures of the data storage system of the invention can be made in a multilayer configuration building further on the basic GMR- or TMR-stack of the system. As such but also in other configurations, the set of structures can be part of a MRAM structure being integrated on a semiconductor substrate. The set of structures can also be part of a non-volatile magnetic memory structure being integrated on a semiconductor substrate. The MRAM data storage systems can be based on magnetic tunnel junctions or GMR spin valves, replacing CMOS capacitors and embedded in a conventional semiconductor chip environment. A typical MRAM cell unit consists of layers of magnetic material separated by a thin non-magnetic insulator through which electrons can tunnel (a basic TMR-stack). The magnetic orientation in the magnetic layers can be independently controlled by applying a magnetic field. The field is created by passing pulses of electric current through thin wires next to, or incorporated in, the MRAM cells. When the magnetic layers have the same orientation, a current tunnels between them and through the insulator more easily than when the orientations are different. The cell can therefore be switched between two states, representing a binary 0 and 1. As an example, the tunneling characteristics of a Co/Al-oxide/NiFe tunnel junction demonstrate a significantly larger resistance with an anti-parallel magnetic orientation compared to the parallel state. The thresholds between the two states are determined by the coercive fields of the magnetic layers ($H_c$(Co)=1.6 kA/m and $H_c$(NiFe)=0.35 kA/m) and can be adjusted by the choice of material and thickness. In the example, all layers can be deposited by magnetron sputtering. The Al-oxide layers can be plasma oxidized in pure $O_2$ at 100 mbar pressure for 60–180 seconds. The rms roughness of the films is critical to the signal height and is below 0.3 nm.

For magnetic storage the orientation of one of the magnetic layers can be kept fixed and pinned by the antiferromagnet. Because data in an MRAM is stored magnetically, the data is kept whether the device is powered or not, i.e., it is non-volatile. Advantages of the MRAM include: higher speed than today's static RAM and higher density than DRAM because the signal height does not scale with the cell area of the magnetic tunnel junction. The read/write times can be as short as 10 nanoseconds, about six times faster than today's fastest RAM memory. Furthermore, the relatively simple principle permits more flexibility in circuit design.

A sensing system according to another aspect of the invention can be a magnetic sensor device or a magnetic read-head such as a GMR thin film head for hard disks or any such system including signal processing electronics for processing the signal of the magnetic characteristic or a measure or derivative thereof. The set of structures of the sensing system of the invention can be made in a multilayer configuration building further on the basic GMR- or TMR-stack of the system. Therefore at least part of the system is manufacturable without significantly changing a standard production process to thereby make at least part of the system at a low cost. It is possible in an embodiment of the invention to integrate the whole sensing system on an Alsimag (a mixture of oxides) slider or on one semiconductor (silicon) chip with the multilayer configuration being grown or deposited on the chip. The multilayer configuration can be grown or deposited on the chip in the front-end or in the back-end of the process for making the chip. In the back-end process a part of the chip is planarized and the multilayer configuration is deposited or grown thereon. Appropriate connections by bonding or via structures are made in order to transfer the signals of the multilayer configuration to the part of the chip containing the signal processing logic. In the front-end process, the multilayer configuration is directly integrated on the semiconductor (silicon). The sensing system of the invention can also be an integrated circuit with a memory functionality and an integrated sensing system or an ASIC with an embedded non-volatile magnetic memory element and a sensing system or a chipcard with a sensing system or any such sensing system. The set of structures of the sensing system of the invention can be made in a multilayer configuration building further on the basic GMR- or TMR-stack of the system.

These and other embodiments of the invention will be elucidated with reference to the drawings.

DETAILED DESCRIPTION OF THE PREFERRED EMBODIMENTS

The present invention will be described with reference to certain embodiments and with reference to certain drawings but the present invention is not limited thereto but only by the claims. In particular embodiments of the invention of magnetic multilayer configurations based on a basic GMR- or TMR-stack are disclosed. These multilayer configurations can be integrated in the systems of the invention according to techniques known to the person of skill in the art. It is for example possible in an embodiment of the invention to integrate the whole sensing or data storage system on one semiconductor (silicon) chip with the multilayer configuration being grown or deposited on the chip. The multilayer configuration can be grown or deposited on the chip in the front-end or in the back-end of the process for making the chip. In the back-end process a part of the chip is planarized and the multilayer configuration is deposited or grown thereon. Appropriate connections by bonding or via structures are made in order to transfer the signals of the multilayer configuration to the part of the chip containing the signal processing logic. It will be apparent to the person skilled in the art that other alternative and equivalent embodiments of the invention can be conceived and reduced to practice without departing form the true spirit of the invention, the scope of the invention being limited only by the appended claims.

Figure 1:
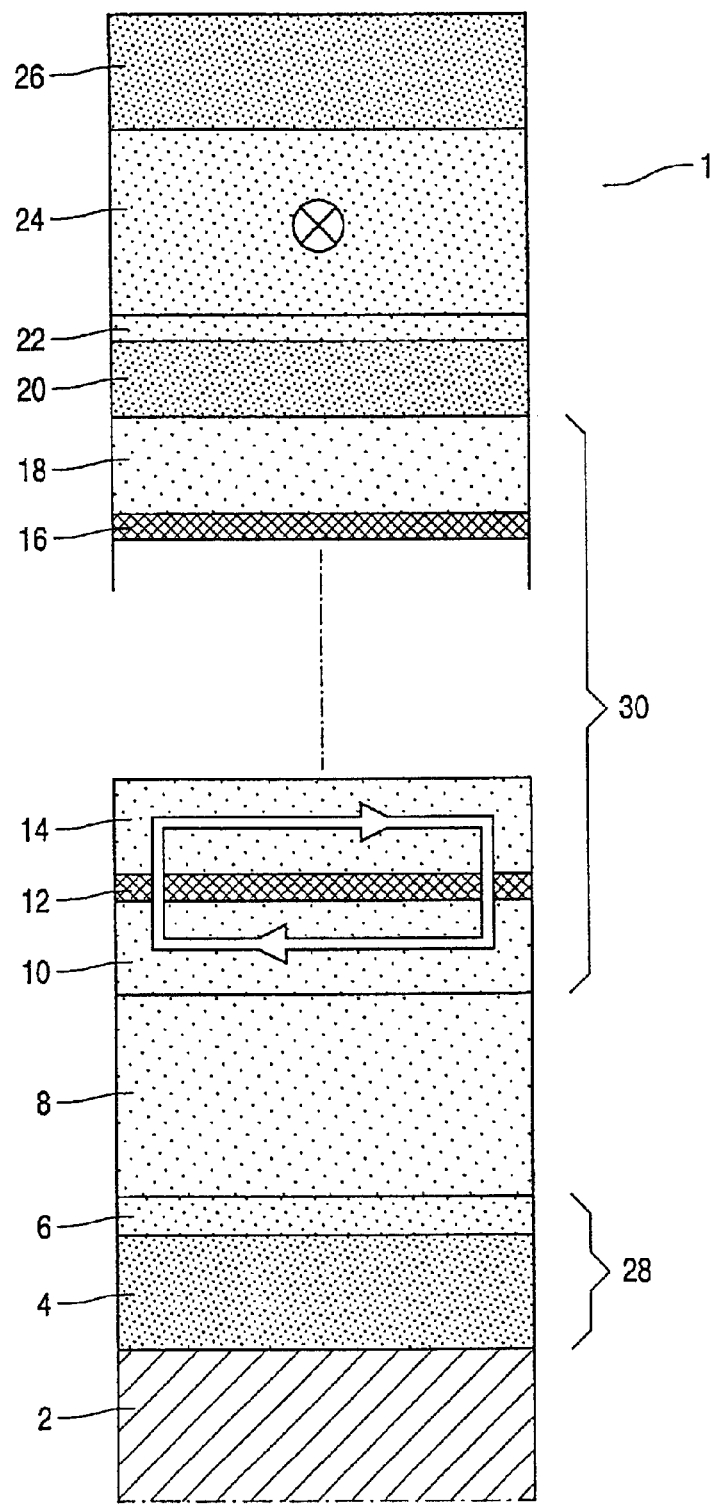
FIG. 1 shows a schematic cross-section through a first embodiment of the magneto-resistive device according to the present invention.

FIG. 1 shows a schematic composition of a first embodiment of the inventive GMR multilayer stack 1. On a substrate 2 (e.g. glass, a semiconductor material like Si or a ceramic material, such as $Al_2O_3$), a buffer layer 28 to modify the crystallographic texture or grain size of the subsequent layer(s), if needed, is provided. If used, the buffer layer 28 may comprise, for instance and preferably, a first sublayer 4 of Ta and a second sublayer 6 of NiFe. On the buffer layer 28 an exchange bias layer 8 is deposited. The exchange bias layer may be, for instance, an FeMn, NiMn, PtMn, NiO or most preferably an IrMn type material (e.g. 10 nm IrMn). By IrMn is meant IrMn or an alloy of IrMn with at least one further metal. On top of the exchange bias layer 8 an artificial antiferromagnetic (AAF) stack 30 is provided which comprises an odd number of ferromagnetic layers 10, 14, 18, the odd number being equal to or greater than 3 with non-magnetic layers 12, 16 interspersed therebetween. The stack 30, may comprise, for instance, a first $Co_{90}Fe_{10}$ layer 10 (e.g. 4.0. nm thick), a first Ru layer 12 (e.g. 0.8 nm thick) and a second $Co_{90}Fe_{10}$ layer 14 (e.g. 4.0 nm thick). To obtain an odd number of ferromagnetic layers in the stack 30 a second Ru layer 16 (e.g. 0.8 nm thick) and a third $Co_{90}Fe_{10}$ layer 18 (e.g. 4.0 nm thick) is added. For higher odd or even numbers of ferromagnetic layers, additional Ru/CoFe layer combinations may be added. On the AAF stack 30 a non-magnetic spacer layer 20 is deposited. The material of the spacer layer can be a Cu-type material. By Cu-type is meant Cu (e.g. 2.5 nm thick Cu) or an alloy of Cu with a further metal, in particular Ag. On top of the spacer layer 20 a layer 22 of $Co_{90}Fe_{10}$ (e.g. 0.8 nm thick) is provided which carries a $Ni_{80}Fe_{20}$ layer 24 (e.g. 5 nm thick). A protective layer 26 (e.g. of 4 nm Ta) covers the layer system.

In order to demonstrate the improved magnetic field range of the present invention, samples similar to those shown in FIG. 1 with differing numbers of ferromagnetic layers in the AAF stack 30, both odd and even, were prepared such that the total amount of ferromagnetic material in the AF stacks 30 was kept essentially the same. Thicknessess of the materials are given in Table 1. As can be seen from this table the thickness of the ferromagnetic layers towards the outside of the stack of layers was made in some cases thinner than layers towards the center of the stack. However, the present invention includes making the thickness of outer ferromagnetic layers thinner than an inner layer.

Figure 2:
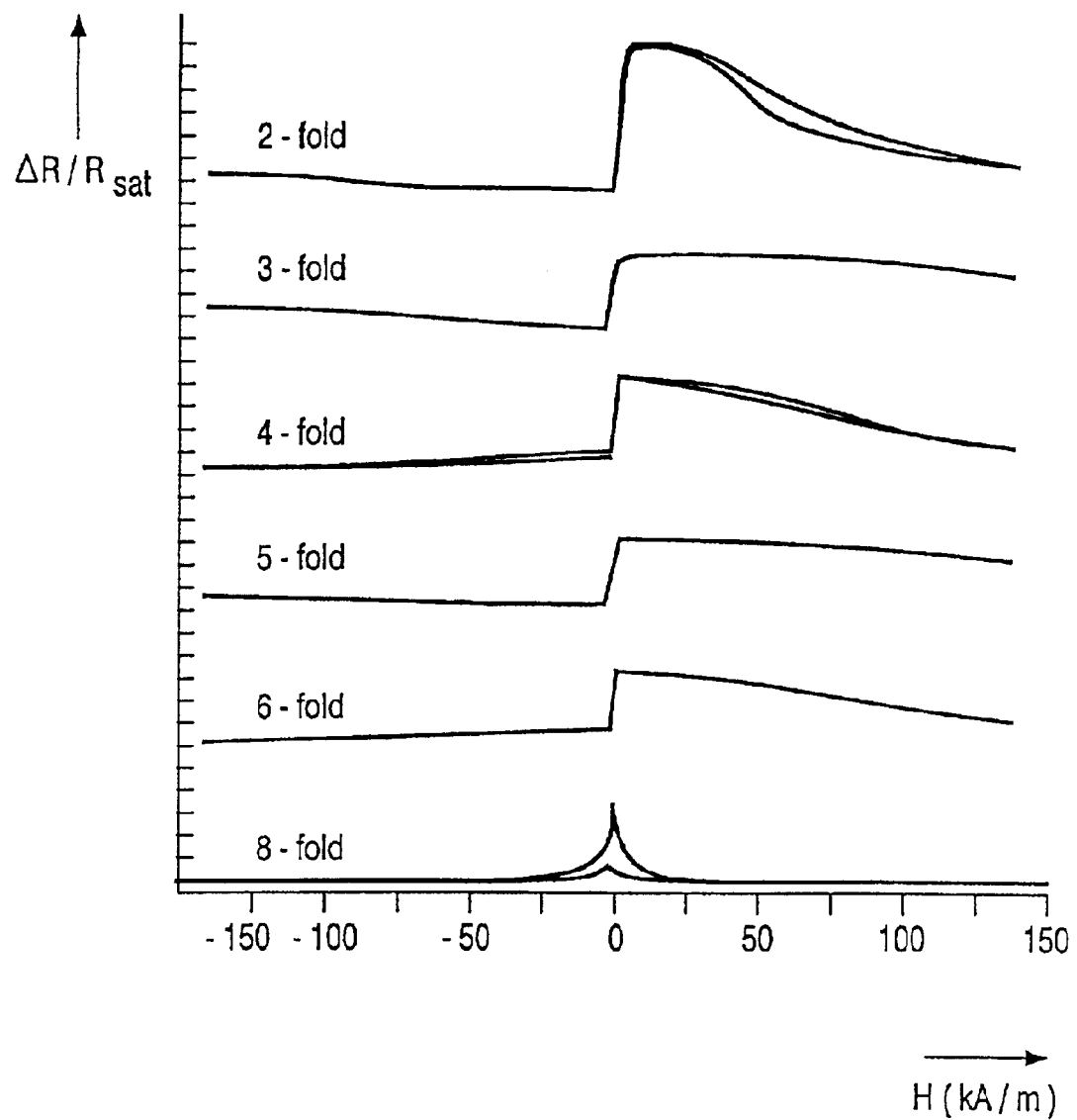
FIG. 2 shows magnetoresistance curves of devices in accordance with FIG. 1 with odd and even numbers of ferromagnetic layers.

The magnetoresistance curves were measured in a parallel magnetic field (with respect to the exchange biasing direction). The measurements are shown in FIG. 2 whereby the individual curves have been offset vertically to allow easy comparison. The most remarkable result is that the magnetoresistance of the 3-fold and 5-fold AAF stack 30 is remarkably flat at both sides of zero field. This is particularly advantageous for sensor applications.

This important result could only be obtained with the odd number combinations of ferromagnetic layers in the AAF stack 30. In addition, the combination of the IrMn exchange bias layer with the AAF stack 30 provides high temperature stability, e.g. at temperatures of 250° C. to 350° C. or higher, without rotation of the direction of the exchange biasing.

The free layer may be a single CoFe layer, or a plurality of sublayers (e.g. CoFe+NiFe; CoFe+NiFe+CoFe, etc.)

Instead of CoFe, Co of CoNiFe may be used, but if CoNiFe is used, it should preferably not be contiguous with the Cu spacer layer.

The AAF may comprise a plurality of ferromagnetic and non-magnetic layers. Each ferromagnetic layer may be composed as described with respect to the free layer.

The sensor may comprise a combination of two pinned ferromagnetic layers and a free ferromagnetic layer.

The inventive sensor can also be used as a data storage cell. An angle set between the magnetization directions of the free and the pinned layer is representative for e.g. a "0" or a "1". The data content can be read out by measuring the resistance of the memory "cell".

The above embodiment relates to a robust GMR or TMR effect type multilayer device comprising a free and a pinned ferromagnetic layer, which has a large magnetic field range as required in automotive applications. The GMR multilayer has an asymmetric magneto-resistive curve and enables sensors with complementary output signals. A further improvement is obtained by a combination of measures including the use of a combination of the exchange-biased Artificial Anti Ferromagnet as the pinned layer and an IrMn exchange-biasing layer, the latter preferably arranged at the bottom of the layer stack on top of a buffer layer.

The described material system may be widely used in GMR-sensors, in particular for automotive and industrial applications. Specific applications are digital position sensors (e.g. for crankshaft position) and analog angle sensors (e.g. valve position, pedal position, steering wheel position). As the inventive sensor has an asymmetric magneto-resistance curve, it enables sensors with complementary output signals. Sensor elements which provide complementary output signals can be made by producing a first free/pinned layer system in which the (magnetic orientation of the) pinned layer is +90° with respect to the free layer and

TABLE 1

THICKNESS OF THE RESPECTIVE LAYERS IN NM

| No. | CoFe | Ru | CoFe | Ru | CoFe | Ru | CoFe | Ru | CoFe | Ru | CoFe | Ru | CoFe | Ru | CoFe |
|---|---|---|---|---|---|---|---|---|---|---|---|---|---|---|---|
| 2 | 4 | 0.8 | 4 | | | | | | | | | | | | |
| 3 | 2 | 0.8 | 4 | 0.8 | 2 | | | | | | | | | | |
| 4 | 2 | 0.8 | 2 | 0.8 | 2 | 0.8 | 2 | | | | | | | | |
| 5 | 1.4 | 0.8 | 2 | 0.8 | 1.4 | 0.8 | 2 | 0.8 | 1.4 | | | | | | |
| 6 | 1.4 | 0.8 | 1.3 | 0.8 | 1.4 | 0.8 | 1.3 | 0.8 | 1.4 | 0.8 | 1.3 | | | | |
| 8 | 1 | 0.8 | 1 | 0.8 | 1 | 0.8 | 1 | 0.8 | 1 | 0.8 | 1 | 0.8 | 1 | 0.8 | 1 |

*Number of non-adjacent ferromagnetic layers a second free/pinned layer system in which the (magnetic orientation of the) pinned layer is at −90° with the free layer. Orienting the pinned layer can be achieved by heating and cooling the layer in a magnetic field having the desired orientation. Such a method is described in the "Robust Giant Magnetoresistance Sensors" by K. M. Lenssen, 13th European Conference on Solid-State Transducers, Sep., 12–15, 1999, The Hague, The Netherlands.

Figure 3:
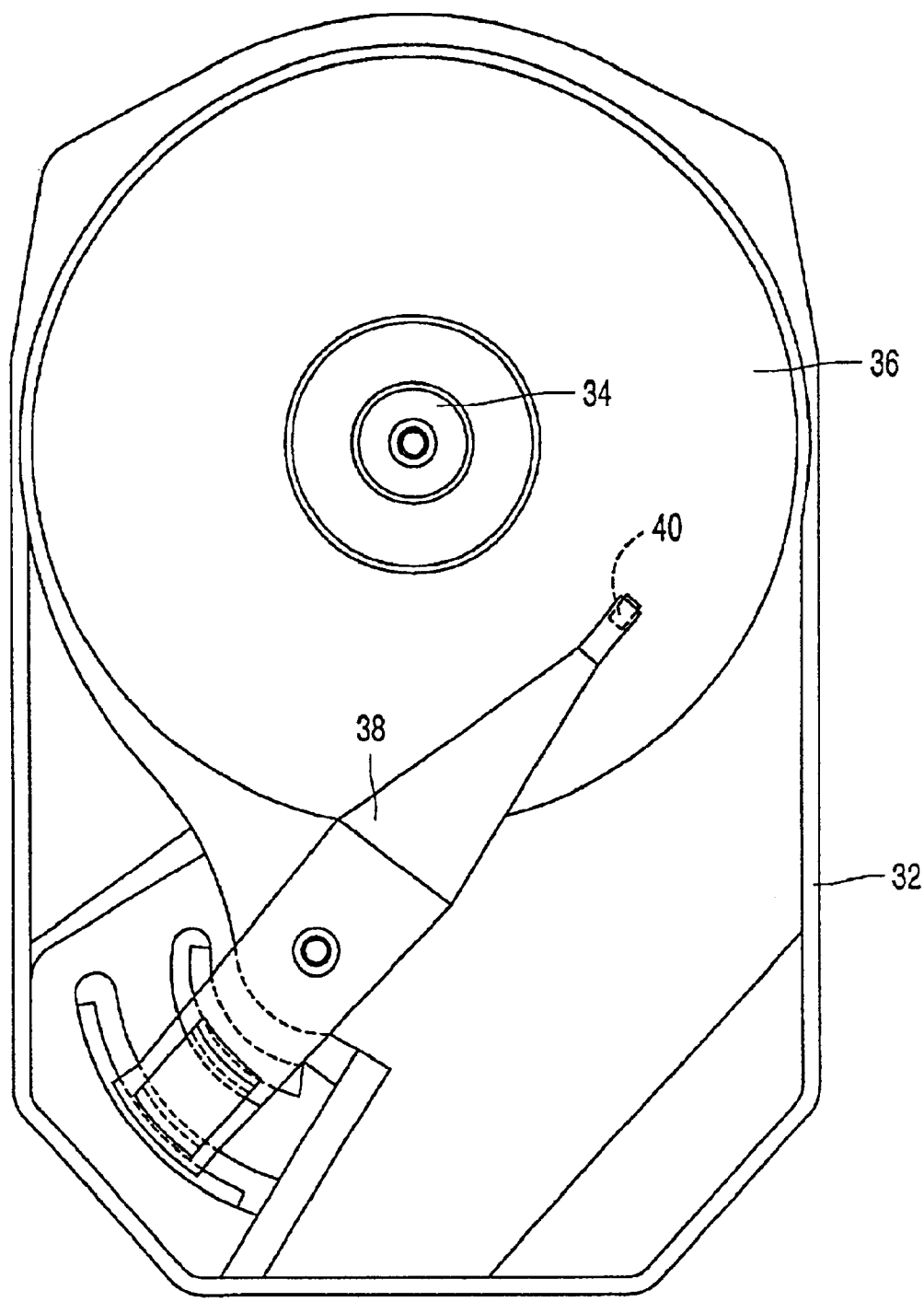
FIG. 3 shows a schematic top view of a data storage system including the magneto-resistive device according to the present invention.

The data storage system according to the invention shown in FIG. 3 includes a frame 32 and a spindle 34 rotatably mounted in the frame 32 for carrying storage medium, particularly a disk-like information carrier 36, such as a magneto-optical disc. The information carrier 36 may be an integrated carrier or a removable carrier. The system further includes a laser source and a swing-arm 38 carrying a slider with a read head 40 comprising the magneto-resistive device according to the invention. Drives are provided for driving the spindle 34 and the arm 38. In an operational state the read head 40 senses information present on the rotating information carrier 36, the head being disposed opposite to the information carrier 36 and moving substantially radially with respect to the carrier 36. The system shown according to the invention may also be a system for reading information from a card or tape.

Figure 4:
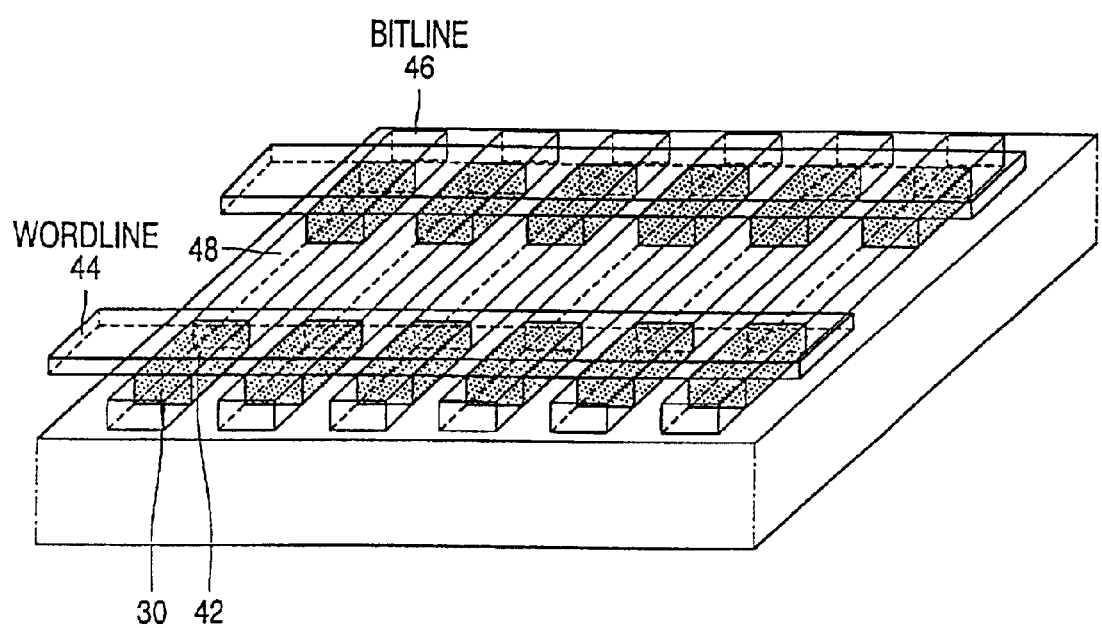
FIG. 4 shows a magnetic memory including the magneto-resistive device according to the present invention.

The magnetic memory according to the invention shown in FIG. 4 includes memory elements 42, word-lines 44 and bit-lines 46 to select a specific memory element. Each memory element 42 includes the AAF layer system 30. The memory elements 42 in a bit-line 46 are separated from each other by a non-magnetic metal 48 with a low resistivity, e.g. Cu.

While the invention has been shown and described with reference to preferred embodiments, it will be understood by those skilled in the art that various changes or modifications in form and detail may be made without departing from the scope and spirit of this invention as defined in the attached claims.

What is claimed is:

1. A magneto-resistive device comprising a substrate which carries a free and a pinned ferromagnetic layer separated by a non-magnetic spacer layer therebetween for providing a magnetoresistive effect, said pinned layer comprising an artificial antiferromagnet layer system (AAF), and an exchange biasing layer, the AAF layer system including at least one CoFe layer, the exchange biasing layer being adjacent to and magnetically influencing the AAF layer system, said free layer including at least one CoFe layer, and said non-magnetic spacer layer being a Cu-type layer, wherein a side of the Cu-type layer is contiguous with a CoFe layer of the free ferromagnetic layer, and another side of the Cu-type layer is contiguous with the CoFe layer of the AAF system.

2. A device as claimed in claim 1, in which the AAF layer system has an odd number of non-adjacent ferromagnetic layers greater than or equal to three.

3. A device as claimed in claim 2, in which the AAF layer system includes three non-adjacent ferromagnetic layers and two intermediate non-magnetic layers, and all said three ferromagnetic layers are CoFe layers.

4. A device as claimed in claim 3, wherein each of the intermediate layers of the AAF is a Ru layer.

5. A device as claimed in claim 2, wherein each of said non-adjacent ferromagnetic layers comprises a stack of ferromagnetic layers.

6. A device as claimed in claim 5, wherein at least two ferromagnetic layers towards the outside of the stack are thinner than a ferromagnetic layer towards the center of the stack.

7. A device as claimed in claim 5, wherein at least two ferromagnetic layers towards the outside of the stack are thicker than a ferromagnetic layer towards the center of the stack.

8. A device as claimed in claim 1, in which the exchange biasing layer is arranged between the substrate and the AAF layer system.

9. A data storage system including a magneto-resistive device according to claim 1.

10. A magnetic memory including a magneto-resistive device according to claim 1.

* * * * *

UNITED STATES PATENT AND TRADEMARK OFFICE
CERTIFICATE OF CORRECTION

PATENT NO. : 6,891,366 B2
DATED : May 10, 2005
INVENTOR(S) : Kars-Michiel Hubert Lenssen and Antonius Emilius Theodorus Kuiper It is certified that error appears in the above-identified patent and that said Letters Patent is hereby corrected as shown below:

Insert Item -- [73], Assignee: Koninklijke Philips Electronics N.V., Eindhoven (NL) --.

Signed and Sealed this

Ninth Day of August, 2005

JON W. DUDAS
*Director of the United States Patent and Trademark Office*